(12) United States Patent
Arai

(10) Patent No.: US 6,362,437 B1
(45) Date of Patent: Mar. 26, 2002

(54) MOUNTING STRUCTURE OF INTEGRATED CIRCUIT DEVICE HAVING HIGH EFFECT OF BUFFERING STRESS AND HIGH RELIABILITY OF CONNECTION BY SOLDER, AND METHOD OF MOUNTING THE SAME

(75) Inventor: Osamu Arai, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/597,899

(22) Filed: Jun. 19, 2000

(30) Foreign Application Priority Data

Jun. 17, 1999 (JP) .............................. 11-171547

(51) Int. Cl.⁷ ................................. H05K 1/16
(52) U.S. Cl. ................. 174/260; 174/261; 174/262; 361/743; 361/760; 361/783; 361/803; 257/738; 257/774; 257/778
(58) Field of Search .................... 174/260, 258, 174/259, 255, 261, 262, 263, 267; 361/760, 736, 743, 771, 772, 773, 774, 792, 803, 807, 816, 768, 783; 257/618, 737, 738, 772, 774, 778, 692, 779, 780, 686

(56) References Cited

U.S. PATENT DOCUMENTS 5,477,933 A * 12/1995 Nguyen ..................... 174/262
5,483,421 A * 1/1996 Gedney et al. ............. 361/771
5,598,036 A * 1/1997 Ho ............................. 257/738
5,659,203 A * 8/1997 Call et al. ................... 257/778
5,834,848 A * 11/1998 Iwasaki ...................... 257/778
5,973,406 A * 10/1999 Harada et al. .............. 257/780
5,973,930 A * 10/1999 Ikeda et al. ................. 361/768
6,163,462 A * 12/2000 Buck .......................... 361/767
6,177,728 B1 * 1/2001 Susko et al. ................ 257/737
6,177,731 B1 * 1/2001 Ishida et al. ................ 257/780
6,191,952 B1 * 2/2001 Jimarez et al. ............. 361/771

FOREIGN PATENT DOCUMENTS

JP          1-117049          5/1989

* cited by examiner

Primary Examiner—Jeffrey Gaffin
Assistant Examiner—I B Patel
(74) Attorney, Agent, or Firm—Young & Thompson

(57) ABSTRACT

A mounting structure of an integrated circuit device includes an integrated circuit device, a mounting board, a first solder bump, and a second solder bump. The integrated circuit device is mounted on the mounting board. The interposer board is interposed between the integrated circuit device and the mounting board. The first solder bump electrically connects the interposer board to the mounting board. The first solder bump is provided between the interposer board and the mounting board. The second solder bump buffers a stress. The second solder bump is provided between the interposer board and the mounting board.

16 Claims, 5 Drawing Sheets

THE NUMBER OF RELATIVE TOTAL PADS

MOUNTING STRUCTURE OF INTEGRATED CIRCUIT DEVICE HAVING HIGH EFFECT OF BUFFERING STRESS AND HIGH RELIABILITY OF CONNECTION BY SOLDER, AND METHOD OF MOUNTING THE SAME

BACKGROUND OF THE INVENTION

1. Field of the Invention

The present invention relates to a mounting structure of an integrated circuit device suitable for usage, for example, when LSI and the like are mounted on a printed wiring board, and a method of mounting the same.

2. Description of the Related Art

In recent years, a surface mounting technique using an interposer board has been employed in an electronic apparatus, such as a large computer and the like, in many cases, associated with an integrated circuit of high density.

Conventionally, a structure as shown in FIG. 1 has been employed as a structure in which this type interposer board is used to mount an integrated circuit device on a mounting board.

This mounting structure of the integrated circuit device will be described below with reference to FIG. 1. In FIG. 1, the mounting structure of the integrated circuit device is denoted by a symbol 41. The mounting structure 41 has a mounting board 42, the interposer board 43 and an integrated circuit device 44.

The mounting board 42 is a printed wiring board, and accommodated in a body of an electronic apparatus (not shown). The interposer board 43 has a through-hole 43a, and is connected to the mounting board 42 with a solder bump (eutectic solder ball) 45. The solder bump 45 is used for connecting the interposer board 43 to the mounting board 42.

In a plan view (not shown) of the mounting structure 41, a plurality of the solder bump 45 are arrayed in a grid form except a center portion of the plan view on positions corresponding to terminals (not shown) of the integrated circuit device 44. A stress buffering resin 46 made of epoxy resin is interposed between the interposer board 43 and the mounting board 42.

The integrated circuit device 44 is an LSI chip and connected to the interposer board 43 with a solder bump (solder ball with a high melting point) 47. The solder bump 47 is used for connecting the integrated circuit device 44 to the interposer board 43. That is, the integrated circuit device 44 is mounted through the interposer board 43 on the mounting board 42 by using both the solder bumps 45, 47.

In the plan view of the mounting structure 41, a plurality of the solder bump 47 are arrayed in a grid form except the center portion, similarly to the solder bump 45. A stress buffering resin 48 made of epoxy resin is interposed between the integrated circuit device 44 and the interposer board 43.

The following is a method of mounting the integrated circuit device 44 on the mounting board 42, in such mounting structure 41. At first, the integrated circuit device 44 is placed through the solder bump 47 on the interposer board 43. Then, the stress buffering resin 48 is injected between the integrated circuit device 44 and the interposer board 43. After that, the interposer board 43 is placed through the solder bump 45 on the mounting board 42. After that, the stress buffering resin 46 is injected between the mounting board 42 and the interposer board 43.

By the way, in this type mounting structure of the integrated circuit device, there is a temperature variation between a time of the mount work and a time after the mount work or between an operation of the device and a non-operation of the device. As a result, if free expansions and contractions of the integrated circuit device 44, the interposer board 43 and the mounting board 42 are obstructed because of difference between thermal expansions of the respective materials, tension and compression are applied to the integrated circuit device 44 and both the boards 42, 43. Thus, this results in the occurrence of thermal stress corresponding to distortion corresponding to deformation caused by the above-mentioned tension and compression.

In this case, if the connection (contact) areas of the respective solder bumps 45, 47 to the mounting board 42, the interposer board 43 and the integrated circuit device 44 are equal to each other, the thermal stress is equally dispersed to and left in the respective solder bumps 45, 47, at a normal temperature. This may be understood from FIG. 2 which shows the relationship between a stress per bump (pad) (a vertical axis) and the number of relative total pads (a horizontal axis).

Thus, the integrated circuit device 44 together with the stress buffering resins 46, 48 may be retained through the interposer board 43 on the mounting board 42 by the solder bumps 45, 47 until stresses applied to the solder bumps 45, 47 reach yield points of the materials of the solder bumps 45, 47.

In the conventional mounting structure of the integrated circuit device, the stress buffering resins 46, 48 are injected into and interposed in a gap between the mounting board 42 and the interposer board 43 as well a gap between the integrated circuit device 44 and the interposer board 43. Thus, those stress buffering resins 46, 48 can not be filled in the gaps. That is, it is impossible to surely place the stress buffering resin in a desirable position in the gaps. Moreover, it is impossible to attain the excellent connection strength to be attained by the solder bumps 45, 47.

This reason is as follows. The gap formed between the mounting board 42 and the interposer board 43 as well as between the integrated circuit device 44 and the interposer board 43 is very narrow in dimension. Thus, if the stress buffering resins 46, 48 are injected into the gaps, those stress buffering resins 46, 48 cause babble to be easily induced. Hence, this babble obstructs the injection of the stress buffering resins 46, 48. Or, the babble causes the external force to be applied to the solder bumps 45, 47 in a direction in which they are separated from the mounting board 42 and the interposer board 43.

As a result, it is impossible to sufficiently insure the supply amounts of the stress buffering resins, and also impossible to surely carry out the connections between the solder bumps. This results in a problem of reducing the effect of buffering the stress and the reliability of connection by the solder bumps.

Also, the interposition of the stress buffering resin 46 between the mounting board 42 and the interposer board 43 increases the number of work processes at a time of the mount work, which results in a problem that the mount work becomes complex.

Japanese Laid Open Patent Application (JP-A-Heisei, 1-117049) discloses a conventional technique as an apparatus for cooling an integrated circuit device. In this apparatus, at least one or more integrated circuit device chips are mounted on an electrical printed wiring board through solder ball. In the apparatus for cooling the integrated circuit device that seals by using a sealing cap so as to cover the integrated circuit device chip, the rear side of the integrated circuit device chip and the inner surface of the sealing cap are finely divided and joined to each other by using a high temperature conductive jointing material. However, this apparatus does not solve the above-mentioned problems.

The present invention is accomplished in view of the above mentioned problems. Therefore, an object of the present invention is to provide a mounting structure of an integrated circuit device which can improve the effect of buffering the stress and the reliability of the connection by the solder bumps and also simplify the mount work, and a method of mounting the same.

Another object of the present invention is to provide an integrated circuit device, which can improve the effect of buffering the stress and the reliability of the connection by the solder bumps by noticing that the interposer board has a function of preventing a radioactive ray ($\alpha$ line) generated from the solder from entering into the integrated circuit device from the side of the mounting board and then interposing the solder bump between the mounting board and the interposer board as the stress buffering material, and a method of mounting the same.

SUMMARY OF THE INVENTION

The present invention has been made to solve the above-described problems of the conventional mounting structure of the integrated circuit device. An object of the present invention is to provide to provide a mounting structure of an integrated circuit device which can improve the effect of buffering the stress and the reliability of the connection by the solder bumps and also simplify the mount work, and a method of mounting the same.

Another object of the present invention is to provide an integrated circuit device, which can improve the effect of buffering the stress and the reliability of the connection by the solder bumps by noticing that the interposer board has a function of preventing a radioactive ray ($\alpha$ line) generated from the solder from entering into the integrated circuit device from the side of the mounting board and then interposing the solder bump between the mounting board and the interposer board as the stress buffering material, and a method of mounting the same.

In order to achieve an aspect of the present invention, a mounting structure of an integrated circuit device, includes: an integrated circuit device; a mounting board on which the integrated circuit device is mounted; an interposer board being interposed between the integrated circuit device and the mounting board; a first solder bump electrically connecting the interposer board to the mounting board, wherein the first solder bump is provided between the interposer board and the mounting board; and a second solder bump buffering a stress, wherein the second solder bump is provided between the interposer board and the mounting board.

In this case, the second solder bump is provided without using a resin to buffer a stress provided between the interposer board and the mounting board.

Also in this case, a resin to buffer a stress is not filled in a gap between the interposer board and the mounting board.

In order to achieve another aspect of the present invention, a mounting structure of an integrated circuit device further includes: a third solder bump connecting the integrated circuit device to the interposer board, wherein the third solder bump is provided between the integrated circuit device and the interposer board; and a specific resin buffering a stress, wherein the specific resin is provided between the integrated circuit device and the interposer board.

In this case, the specific resin is filled in a gap between the integrated circuit device and the interposer board.

Also in this case, the specific resin is epoxy resin.

Further in this case, a through hole is formed in the interposer board to connect the first solder bump to the third solder bump.

In this case, a plurality of the first solder bumps are provided in a grid form.

Also in this case, a plurality of the second solder bumps are provided in a grid form.

Further in this case, a plurality of the first solder bumps are provided in a grid form, and a plurality of the second solder bumps are provided in a grid form with a substantially same interval as an interval between the plurality of first solder bumps.

In this case, the plurality of second solder bumps are provided inside the plurality of first solder bumps on the mounting board.

Also in this case, each of the plurality of second solder bumps is provided at a position adjacent to the plurality of first solder bumps on the mounting board.

Further in this case, a plurality of the first and second solder bumps are provided such that a thermal stress generated by a temperature variation between a time when a mounting work of the mounting structure is performed and a time after the mounting work is performed or between a time when the integrated circuit device is operated and a time when the integrated circuit device is not operated is substantially equally dispersed to and left in respective ones of the first and second solder bumps.

Also in this case, the third solder bump has a melting point higher than those of the first and second solder bumps.

Further in this case, the mounting structure of an integrated circuit device is used in a large scale of computer.

In this case, at least one of the first and second solder bumps is formed to be an eutectic solder ball.

Also in this case, the interposer board has a function of preventing a radioactive ray generated from a solder from entering into the integrated circuit device from a side of the mounting board.

In order to achieve still another aspect of the present invention, a mounting method of an integrated circuit device, includes: (a) providing an interposer board, a plurality of through holes being formed in the interposer board; (b) connecting an integrated circuit device to the interposer board at a position of each of the plurality of through holes; (c) providing a plurality of first solder bumps on a mounting board at a plurality of first specific positions corresponding to the plurality of through holes when the mounting board is connected to the interposer board; (d) providing a plurality of second solder bumps on the mounting board at a plurality of second specific positions other than the first specific positions; and (e) connecting the mounting board to the interposer board by the first and second solder bumps, and wherein the (c) and (d) steps are performed at a substantially same time with each other.

In this case, the (b) step includes connecting the integrated circuit device to the interposer board by a third solder bump provided at the position of each of the plurality of through holes and injecting a specific resin to buffer a stress at a position other than positions in which a plurality of the third solder bumps are provided.

Also in this case, the (b) step includes providing the third solder bump having a melting point higher than those of the first and second solder bumps, and the (e) step includes melting the first and second solder bumps such that the third solder bump is not melted.

Further in this case, the (d) step includes providing the plurality of second bumps inside the plurality of first solder bumps on the mounting board.

BRIEF DESCRIPTION OF THE DRAWINGS

A more complete understanding of the teachings of the present invention may be acquired by referring to the accompanying figures, in which like reference numbers indicate like features and wherein.

DESCRIPTION OF THE PREFERRED EMBODIMENTS

Embodiments of the present invention will be described below with reference to the attached drawings.

Figure 1:
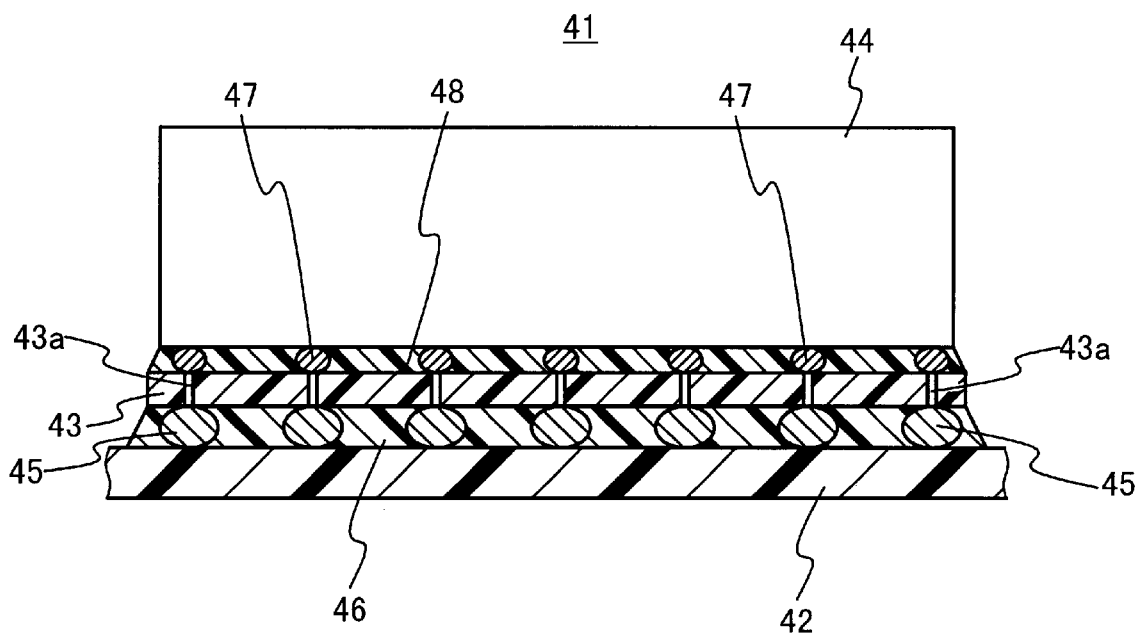
FIG. 1 is a section view showing a conventional mounting structure of an integrated circuit device.
Figure 2:
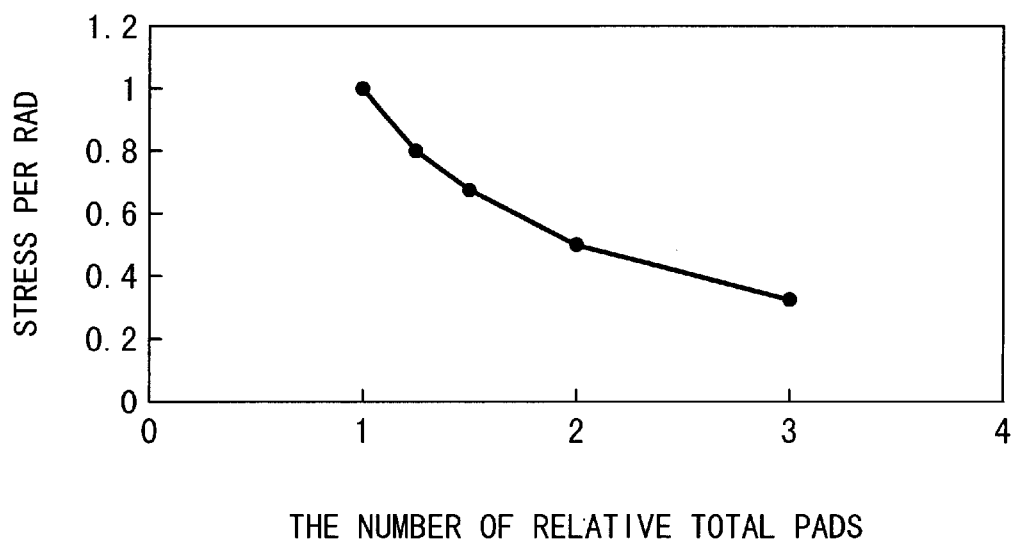
FIG. 2 is a view showing a relationship between a stress per pad and the number of relative total pads, in the conventional mounting structure of the integrated circuit device.
Figure 3:
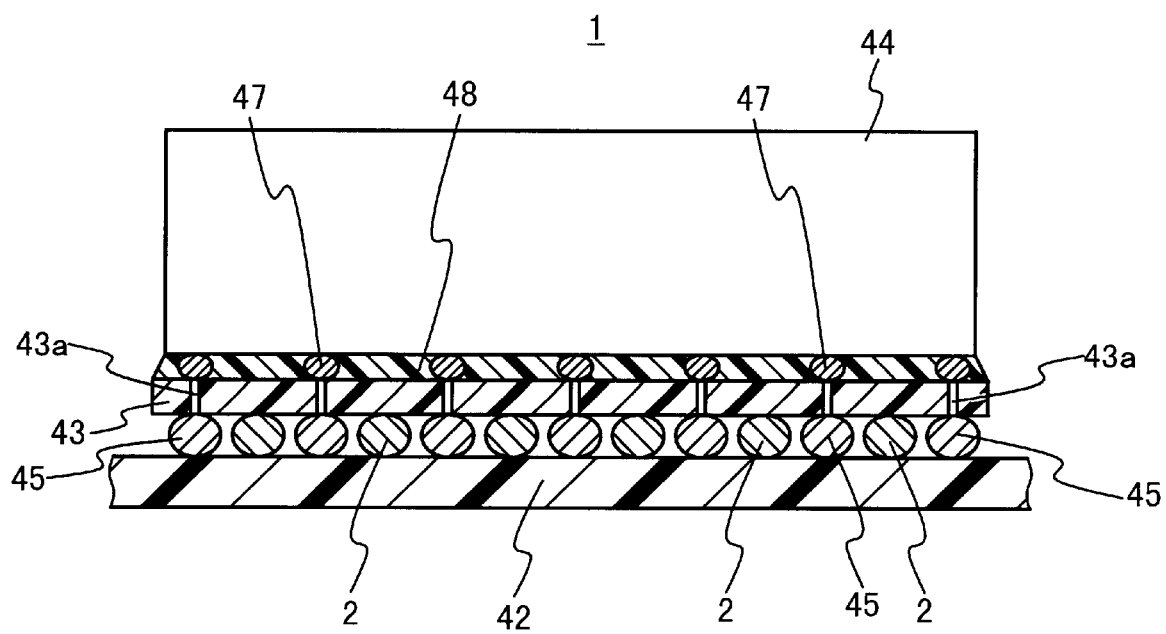
FIG. 3 is a section view showing a mounting structure of an integrated circuit device according to a first embodiment of the present invention.
Figure 4:
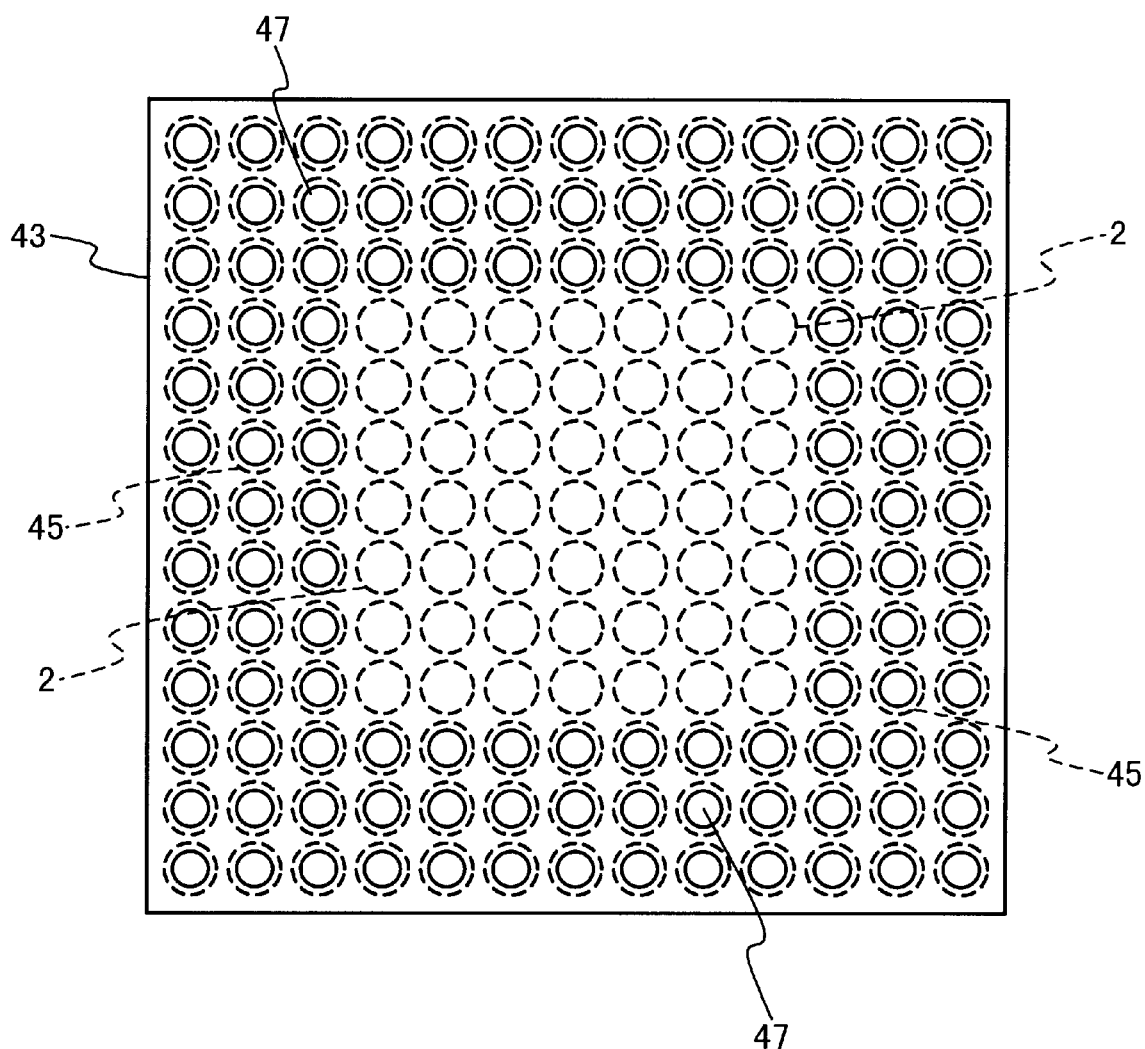
FIG. 4 is a plan view showing an array condition of a plurality of solder bumps in the mounting structure of the integrated circuit device according to the first embodiment of the present invention.
Figure 5A:
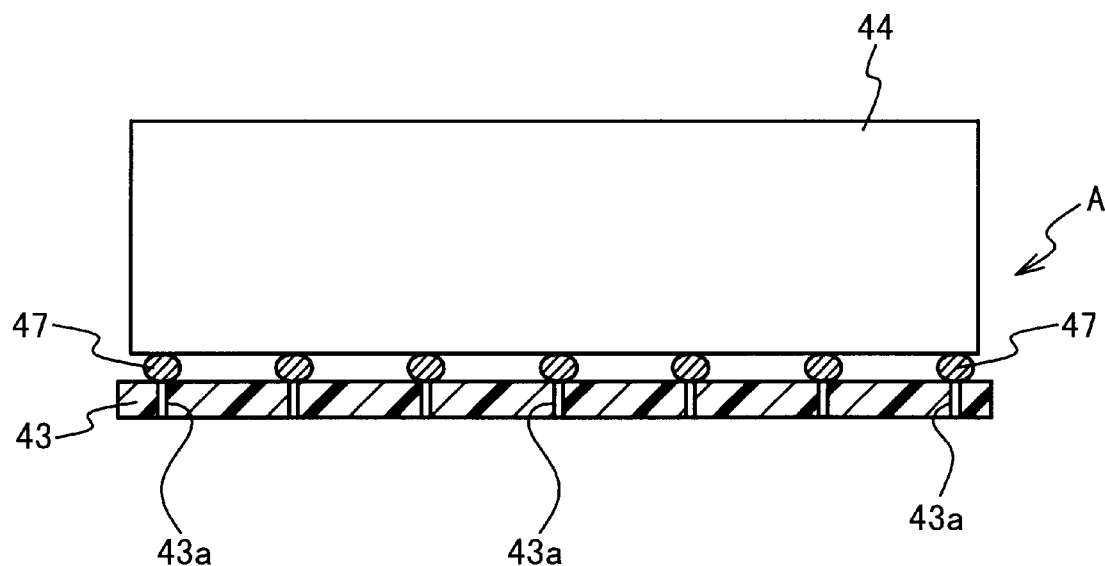
FIG. 5A is a section view describing one process in the mounting method of the integrated circuit device according to the first embodiment of the present invention.
Figure 5B:
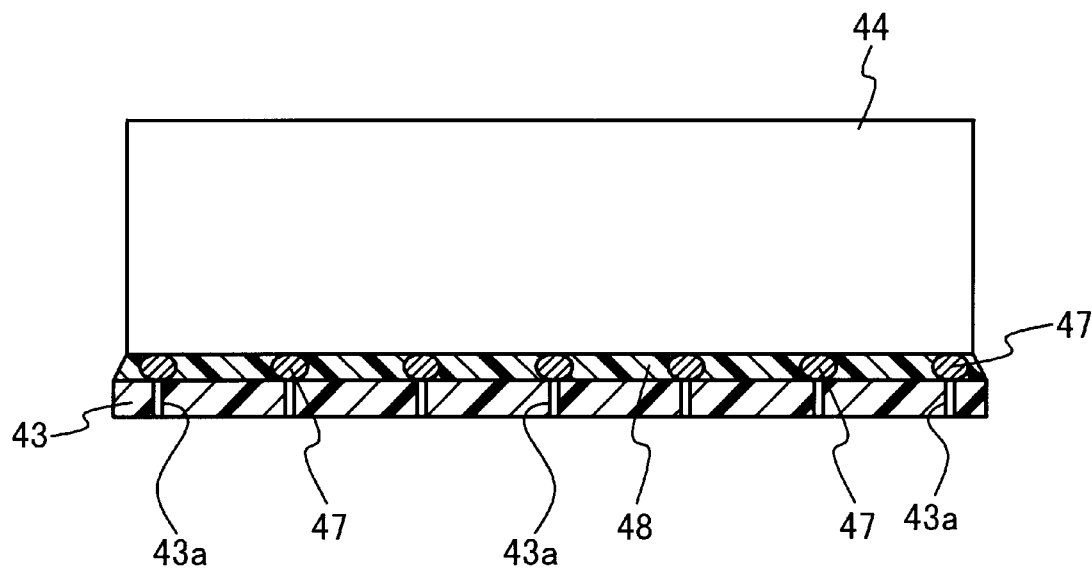
FIG. 5B is a section view describing another process in the mounting method of the integrated circuit device according to the first embodiment of the present invention.
Figure 5C:
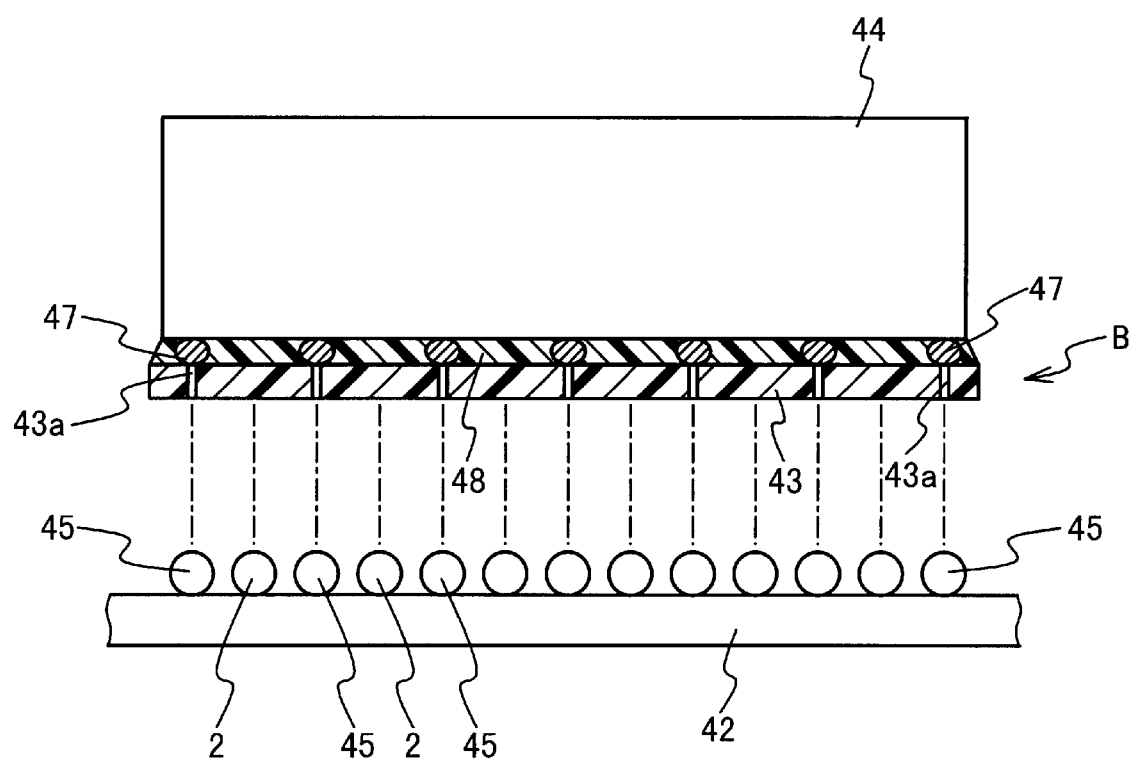
FIG. 5C is a section view describing still another process in the mounting method of the integrated circuit device according to the first embodiment of the present invention.

FIG. 3 is a section view showing a mounting structure of an integrated circuit device according to a first embodiment of the present invention. Similarly, FIG. 4 is a plan view showing the array condition of a plurality of solder bumps, in the mounting structure of the integrated circuit device according to the first embodiment of the present invention. FIGS. 5A, 5B and 5C are section views describing processes in the mounting method of the integrated circuit device according to the first embodiment of the present invention. In FIGS. 3, 4, 5A, 5B and 5C the same symbols are given to the same members as those shown in FIG. 1. Thus, the detailed explanation i s omitted.

In FIGS. 3 and 4, the mounting structure of the integrated circuit device denoted by a symbol 1 has a mounting board 42, an interposer board 43 and an integrated circuit device 44.

The interposer board 43 has a through-hole 43a, and is connected to the mounting board 42 with a solder bump (eutectic solder ball) 45. The solder bump 45 is used for connecting the interposer board 43 to the mounting board 42. In FIG. 4, a plurality of the solder bump 45 are arrayed In a grid form except a center portion of FIG. 4 on positions corresponding to terminals (not shown) of the integrated circuit device In FIG. 4, a plurality of stress buffering solder bumps (eutectic solder balls) 2 are arrayed in a grid form. In FIG. 4, the plurality of stress buffering solder bumps 2 are arrayed in the same interval as the array interval of the solder bumps 45 in vertical and horizontal directions, and are arranged inside the array position of the solder bumps 45. Thus, the thermal stress generated by the temperature variation between a time at a mount work and a time after the mount work or between an operation of the device and a non-operation of the device is equally dispersed to and left in the respective solder bumps 2, 45 at a normal temperature.

The solder bump 2 serving as the stress buffering material is interposed between the mounting board 42 and the interposer board 43, by noticing that the interposer board 43 has the function of preventing the radioactive ray (α line) generated from the solder from entering into the integrated circuit device 44 from the side of the mounting board 42.

By the way, a solder bump 47 is constituted by a solder having a melting point higher than those of the solder bump 45 and the stress buffering solder bump 2. Accordingly, the electric connection of the interposer board 43 to the mounting board 42 is attained by melting the solder bump 45 at a melting temperature lower than that of the solder bump 47 at the time of the mount work.

The method of mounting an integrated circuit device according to the first embodiment of the present invention will be described below with reference to FIGS. 5A to 5C.

At first, the integrated circuit device 44 is placed through the solder bump 47 on the interposer board 43. In this case, the electric connection of the integrated circuit device 44 to the interposer board 43 is attained as follows. That is, the high melting point solder ball (solder bump) 47 is placed on a land position of each through-hole 43a in the interposer board 43. The integrated circuit device 44 is placed such that each terminal (not shown) of the integrated circuit device 44 is in contact with the portion on the high melting point solder ball 47. Then, after a first assembly A is formed as shown in FIG. 5A, this first assembly A is accommodated in a re-flow furnace which is heated at about 300° C. in advance.

Next, the first assembly A is taken away from the re-flow furnace. Then, a stress buffering resin 48 is injected between the integrated circuit device 44 and the interposer board 43, as shown in FIG. 5B. At this time, the stress buffering resin 48 is filled in the gap formed between the integrated circuit device 44 and the interposer board 43.

After that, the interposer board 43 is placed through the solder bump 45 and the stress buffering solder bump 2 on the mounting board 42. In this case, the electric connection via the through-hole 43a of the solder bump 47 to the mounting board 42 is done as follows. That is, the eutectic solder balls (the solder bump 45 and the stress buffering solder bump 2) are placed in a grid form on land positions of the mounting board 42. The interposer board 43 is placed such that the land of each through-hole 43a is in contact with each of the solder bump 45, as shown in FIG. 5C, and then a second assembly B is formed. After that, this second assembly B is accommodated in a re-flow furnace which is heated at about 210 to 310° C. in advance.

As mentioned above, the integrated circuit device 44 can be mounted on the mounting board 42.

Thus, in this embodiment, not only the solder bump 45 but also the stress buffering solder bump 2 can be surely arranged at the desirable position between the mounting board 42 and the interposer board 43 at the time of the mount work. Hence, it is possible to sufficiently insure the supply amount of the stress buffering material and also possible to surely carry out the connection by the solder bumps.

Also, in this embodiment, the interposition of the solder bump 45 and the stress buffering solder bump 2 between the mounting board 42 and the interposer board 43 enables the interposition of those solder bumps 45, 2 to be carried out at the same time, which accordingly enables the reduction of the number of work processes at the time of the mount work.

The array position with regard to the respective solder bumps described in FIG. 3 corresponds to that described in FIGS. 5A, 5B and 5C. The array position with regard to the respective solder bumps described in FIG. 3 does not correspond to that described in FIG. 4. In FIGS. 3, 5A, 5B and 5C, the stress buffering solder bump 2 is arranged in the position adjacent to the solder bump 45. In FIG. 4, the stress buffering solder bump 2 is arranged only in the center portion of the interposer board 43 and the solder bump 45 is arranged only in the peripheral portion of the interposer board 43.

In addition, in this embodiment, it is natural that the array positions on the plan view with regard to the respective solder bumps, the heated temperatures within the re-flow furnaces and the like are not especially limited to the above-mentioned embodiments.

As mentioned above, according to the present invention, the solder bump for connecting the interposer board to the mounting board and the stress buffering solder bump are interposed between the mounting board and the interposer board. Thus, not only the solder bump for connecting the interposer board to the mounting board but also the stress buffering solder bump can be surely arranged at the desirable position between the mounting board and the interposer board at the time of the mount work.

Thus, it is possible to sufficiently insure the supply amount of the stress buffering material and also possible to surely carry out the connection by the solder bumps. Hence, it is possible to improve the effect of buffering the stress and the reliability of the connection by the solder bumps.

Also, the interposition of the solder bump for connecting the interposer board to the mounting board and the stress buffering solder bump between the mounting board and the interposer board enables the interposition of those solder bumps to be carried out at the same time, which accordingly enables the reduction of the number of work processes at the time of the mount work and the simplification of the mount work.

What is claimed is:

1. A mounting structure of an integrated circuit device, comprising:
   an integrated circuit device;
   a mounting board on which said integrated circuit device is mounted;
   an interposer board being interposed between said integrated circuit device and said mounting board, the interposer board having a plurality of electrically conductive through-holes;
   a plurality of first solder bumps melted into contact with both the interposer board and the mounting board, wherein said first solder bumps are provided between said interposer board and said mounting board so that all of the through-holes of the interposer board are in electrical contact with the first solder bumps; and
   a plurality of second solder bumps buffering a stress, wherein said second solder bumps are provided between said interposer board and said mounting board, said second solder bumps being melted into contact with both the interposer board and the mounting board.

2. A mounting structure of an integrated circuit device according to claim 1, wherein said second solder bump is provided without using a resin to buffer a stress provided between said interposer board and said mounting board.

3. A mounting structure of an integrated circuit device according to claim 1, wherein a resin to buffer a stress is not filled in a gap between said interposer board and said mounting board.

4. A mounting structure of an integrated circuit device according to claim 1, further comprising:
   a third solder bump connecting said integrated circuit device to said interposer board, wherein said third solder bump is provided between said integrated circuit device and said interposer board; and
   a specific resin buffering a stress, wherein said specific resin is provided between said integrated circuit device and said interposer board.

5. A mounting structure of an integrated circuit device according to claim 4, wherein said specific resin is filled in a gap between said integrated circuit device and said interposer board.

6. A mounting structure of an integrated circuit device according to claim 4, wherein said specific resin is epoxy resin.

7. A mounting structure of an integrated circuit device according to claim 4, wherein said third solder bump has a melting point higher than those of said first and second solder bumps.

8. A mounting structure of an integrated circuit device according to claim 1, wherein a plurality of said first solder bumps are provided in a grid form.

9. A mounting structure of an integrated circuit device according to claim 1, wherein a plurality of said second solder bumps are provided in a grid form.

10. A mounting structure of an integrated circuit device according to claim 1, wherein a plurality of said first solder bumps are provided in a grid form, and a plurality of said second solder bumps are provided in a grid form with a substantially same interval as an interval between said plurality of first solder bumps.

11. A mounting structure of an integrated circuit device according to claim 10, wherein said plurality of second solder bumps are provided inside said plurality of first solder bumps on said mounting board.

12. A mounting structure of an integrated circuit device according to claim 10, wherein each of said plurality of second solder bumps is provided at a position adjacent to said plurality of first solder bumps on said mounting board.

13. A mounting structure of an integrated circuit device according to claim 1, wherein a plurality of said first and second solder bumps are provided such that a thermal stress generated by a temperature variation between a time when a mounting work of said mounting structure is performed and a time after said mounting work is performed or between a time when said integrated circuit device is operated and a time when said integrated circuit device is not operated is substantially equally dispersed to and left in respective ones of said first and second solder bumps.

14. A mounting structure of an integrated circuit device according to claim 1, wherein said mounting structure of an integrated circuit device is used in a large scale of computer.

15. A mounting structure of an integrated circuit device according to claim 1, wherein at least one of said first and second solder bumps is formed to be an eutectic solder ball.

16. A mounting structure of an integrated circuit device according to claim 1, wherein said interposer board has a function of preventing a radioactive ray generated from a solder from entering into said integrated circuit device from a side of said mounting board.

* * * * *